May 8, 1956 J. STILLMAN 2,745,015

AUTOMATIC TUNER

Filed June 28, 1952

INVENTOR
JEROME STILLMAN
BY
ATTORNEY 2,745,015
Patented May 8, 1956

2,745,015

AUTOMATIC TUNER

Jerome Stillman, Brooklyn, N. Y., assignor to International Telephone and Telegraph Corporation, a corporation of Maryland Application June 28, 1952, Serial No. 296,105

10 Claims. (Cl. 250—40)

This invention relates to automatic tuning systems and more particularly to apparatus for automatically tuning a tank circuit to a resonant condition for an input signal of a given frequency.

In order to operate a radio transmitter efficiently, various stages of the radio transmitter must be adjusted so that they are resonant at the operating frequency. It is desirable to tune these stages to the resonant condition quickly and efficiently and in a predetermined order. Heretofore, the various stages were manually tuned until a meter indicated a resonant condition existed.

One of the objects of this invention, therefore, is to provide a new and improved automatic tuner for radio systems which will tune a tank circuit to a resonant condition for the frequency of the input signal.

Another object of this invention is to provide an automatic tuner for a plurality of stages of a transmitter whereby the various stages will be tuned in a predetermined order.

A further object of this invention is to provide an automatic tuner which will operate efficiently at high speeds and which will require no manual operation once it is started.

In accordance with one feature of this invention, a variable tuning condenser contained in the plate circuit of the R. F. stage to be tuned is driven by a motor through its entire range, and the maximum signal amplitude obtained during this scanning is stored. The motor then tunes the condenser back through the same tuning band until a signal of the same maximum amplitude as that stored is reached, at which time the driving motor is stopped, halting the variable tuning condenser at the position which causes the tank circuit to be resonant for the input signal frequency to the R. F. stage being tuned.

Another feature of this invention is the provision for tuning a plurality of R. F. stages in succession to provide an automatic tuning sequence selection by use of a control circuit which is actuated from each preceding stage as such stage is tuned to a condition of resonance.

Figure 1:
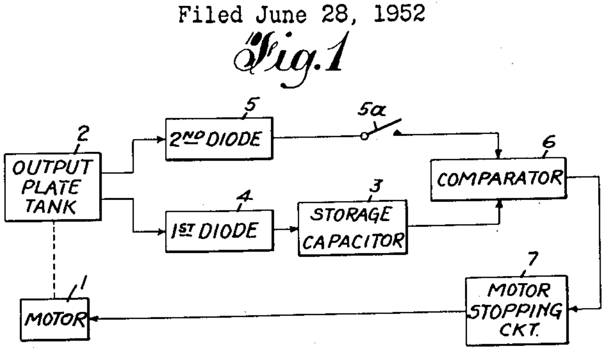
Figure 2:
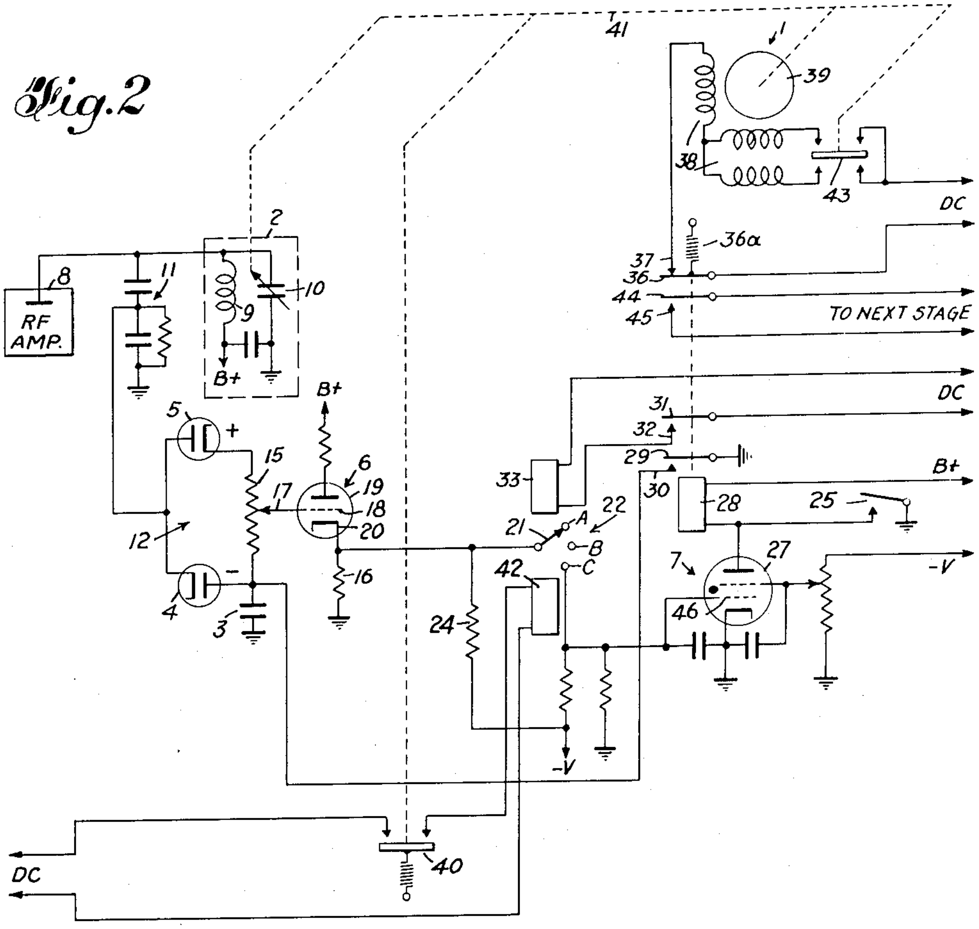

The above-mentioned and other features and objects of this invention will become more apparent by reference to the following description taken in conjunction with the accompanying drawings, in which:

Fig. 1 is a schematic diagram in block form of one embodiment of an automatic tuning system of this invention; and Fig. 2 is a schematic circuit diagram of an embodiment of this invention for use with an R. F. amplifier stage of a radio transmitter.

Referring to Fig. 1, the block diagram of the automatic tuning system in accordance with the principles of this invention shown therein comprises a motor 1 which operates a variable impedance in the output plate tank circuit 2 of the R. F. stage to be tuned. As the tank circuit 2 of the R. F. stage to be tuned is driven through its complete frequency range, a storage capacitor 3 is charged through a diode 4 from the output plate tank 2 to the maximum signal output reached during the scanning.

When the entire frequency band is scanned, a second diode 5 connected to the output plate tank circuit 2 is coupled by switch *5a* to a comparator circuit 6 together with the storage capacitor 3 which has been charged to the maximum signal output during the first scanning period. The motor 1 is reversed, and the plate tank circuit 2 is then tuned to the position of maximum signal amplitude as determined by the comparator 6 which controls a motor stopping circuit 7 to halt the motor 1 when the signal from the second diode 4 is equal to the maximum signal stored in the storage capacitor 3, thus positioning the variable reactance of the plate tank circuit, controlled by motor 1, at a condition of resonance.

Referring now to Fig. 2, an automatic tuner adapted to adjust the tank circuit of an R. F. amplifier stage of a radio transmitter to a condition of resonance in accordance with the principles of this invention is shown.

The R. F. amplifier stage of the transmitter designated as 8 is tuned to a condition of resonance for the input signal frequency by the plate tank circuit 2 comprising inductance 9 and variable tuning capacitor 10. A portion of the output of the amplifier stage 8 is coupled, via voltage divider 11 to rectifier 12. Diode 5 couples the positively rectified output to one side of potentiometer 15 while diode 4 couples the negatively rectified voltage to the other side of potentiometer 15 and to storage capacitor 3. The voltage developed at tap 17 of potentiometer 15 is applied to control electrode 18 of electron discharge device 19. Electron discharge device 19 has its cathode 20 coupled to the armature 21 of step relay 22, to ground through resistor 16, and to a negative biasing voltage through resistor 24.

To initiate the tuning of the plate tank circuit 2 of the R. F. amplifier stage 8 to be tuned, start switch 25 is momentarily closed, causing a current to flow through relay coil 28. As current flows through relay coil 28, it causes normally opened armature 29 to make a momentary closing with contact 30 which causes storage capacitor 3 to discharge to ground. Simultaneous with the discharge of storage capacitor 3, armature 31 closes momentarily with contact 32, causing a current to flow in reset coil 33 of the step relay 22. Reset coil 33 causes armature 21 of step relay 22 to move to position A where the cathode of vacuum tube 19 is disconnected from the control electrode 46 of electron device 27. When momentary closing switch 25 is opened, armature 36, which is normally closed due to spring *36a*, closes with contact 37 causing current to flow in the field coils 38 of the motor 1. As rotor 39 revolves, it causes the variable condenser 10 of the tank circuit 2 to move to one extreme position of its tuning range preparatory for the start of the next tuning cycle regardless of its position when the starting switch 25 was closed. As the extreme limit of the variable condenser 10 is reached, limit switch 40 coupled to the mechanical gearing system 41 momentarily closes causing a current to flow through step relay coil 42 moving armature 21 to position B where the cathode of vacuum tube 19 remains disconnected. Simultaneously with the closing of limit switch 40, reversing limit switch 43 mechanically coupled to motor 39 is caused to move to its opposite position reversing the direction of rotation of rotor 39 which then causes the variable condenser 10 to move toward its other extreme position through its entire tuning range.

As the condenser 10 causes the resonant frequency to vary through the entire tuning range, a portion of the R. F. energy flowing in the plate tank circuit 2 is coupled through voltage divider 11 to rectifier 12. Diode 5 passes the positive portion of the R. F. energy from voltage divider 11 to adjustable potentiometer 15, while diode 4 couples the negative portion to the same adjustable potentiometer. Storage capacitor 3 coupled to the negative side of rectifier 4 charges to the maximum negative signal voltage reached during the scanning of the tuning range by variable condenser 10. During this scanning of the tuning range, the positive voltage coupled to resistor 15 by rectifier 12 never exceeds the negative voltage coupled to resistor 15. As the end of the first complete scanning cycle is reached, limit switch 40 closes causing the armature 21 of step relay 22 to move to position C where the vacuum tube 19 is cathode coupled to the control electrode 46 of gas filled electron discharge device 27. Since the storage capacitor 3 is charged to the maximum negative signal, the grid 44 of tube 27 will have a negative bias and will not conduct. At the same time, reversing switch 43 is moved to its opposite position causing the rotor 39 to reverse its direction of rotation and in turn causing the variable condenser 10 to rescan the tuning range in the opposite direction. When the resonant position is reached by variable condenser 10, the positive energy passed by diode 5 will become equal to the negative voltage stored on capacitor 3; and since the negative and positive bias coupled to potentiometer 15 will then be equal, the bias voltage coupled to the grid 18 of vacuum tube 19 will be zero, causing the vacuum tube 19 to conduct. As current flows in vacuum tube 19, grid 46 of gas filled electron discharge device 27 which is coupled to the cathode of vacuum tube 19 will be driven positive causing a current flow through relay coil 28 which results in armature 36 breaking with contact 37 and thus removing the source of energy from the field coils 38 thereby stopping the motor 1. When tube 27 conducts and current flows in relay coil 28, armature 44 makes contact with point 45 which may be utilized as the starting switch of the automatic tuning system of the next stage so that successive tuning of a plurality of stages may be accomplished. Current flowing in coil 28 also causes armature 31 to close with contact 32 resetting armature 21 of step relay 22 and armature 29 to close with contact 30 discharging storage capacitor 3. The resetting of relay 22 and the discharge of storage capacitor 3 places the circuitry in condition for the start of the next automatic tuning cycle.

In order to compensate for the inertia of rotor 39 and gearing mechanism 41, the tap 17 of potentiometer 15 may be offset from center so that electron discharge device 19 will conduct just before the maximum stored voltage is reached, thus enabling the mechanical system to cease its movement at the desired point.

While I have described above the principles of my invention in connection with specific apparatus, it is to be clearly understood that this description is made only by way of example and not as a limitation to the scope of my invention as set forth in the objects thereof and in the accompanying claims.

I claim:

1. In a radio transmitter, an automatic tuner for the tank circuit of an R. F. stage having an adjustable impedance element comprising means for actuating said adjustable impedance element through its entire range of adjustment, a pair of rectifier devices serially coupled together, means to couple a portion of the voltage of said tank circuit to said rectifier devices so that one produces a negative output and another produces a positive output, means to store the negative output of said one rectifier device, a control device coupled to the outputs of said pair of rectifier devices and storage means, and means responsive to said control device to halt said actuating means when said maximum stored negative voltage is equalled by the output of said positive rectifier device.

2. A device according to claim 1, wherein said means to halt said actuating means includes means to initiate the automatic tuning of a successive stage.

3. A device according to claim 1, wherein said means responsive to said control device includes means to compensate for the time lag in halting said actuating means.

4. A device according to claim 1, wherein said means responsive to said control device includes a gas filled electron discharge device, means to couple the output of said control device to a grid of said gas filled electron discharge device whereby when the rectified positive voltage is equal to the stored negative voltage said gas filled electron discharge device will conduct.

5. In an automatic tuner for a tank circuit having an adjustable impedance element, means for actuating said adjustable impedance element through its entire range of adjustment, means to rectify negatively and positively a portion of the output of said tank circuit, means to store the maximum negative voltage reached during a first adjustment of said impedance element, means to cause said actuating means to initiate a second adjustment of said impedance element, and means to stop said actuating means when said positive rectified voltage of said second adjustment equals the maximum negative voltage stored during said first adjustment.

6. An automatic tuner for a tank circuit comprising an adjustable impedance element for said tank circuit, means for actuating said adjustable impedance element through its entire range of adjustment, means to rectify negatively and positively a portion of the output of said tank circuit, means to store the maximum negative voltage reached during a first adjustment of said impedance device, and means to stop said actuating means when said positively rectified voltage equals the maximum stored negative voltage during a subsequent adjustment of said impedance device.

7. A tuner according to claim 6, wherein said means to stop said actuating means further includes means to compensate for inertia inherent in said actuating means.

8. An automatic tuner for a tank circuit having an adjustable impedance element comprising means for actuating said adjustable impedance element through its entire range of tuning, a pair of rectifier devices serially coupled together, means to couple a portion of the voltage of said tank circuit to said rectifier devices so that one produces a negative output and another produces a positive output, means to couple in opposition the output of said rectifier devices to a potentiometer device, means to store the negative output of said one rectifier device, means to couple said storage means to said potentiometer device, a control device coupled to the output of said potentiometer device, and means responsive to said control device to halt said actuating means when said maximum stored negative voltage is equalled by the output of said positive rectifier device.

9. An automatic tuner for a tank circuit having an adjustable impedance element comprising means for actuating said adjustable impedance element through its entire range of tuning, a pair of rectifier devices serially coupled together, means to couple a portion of the voltage of said tank circuit to said rectifier devices so that one produces a negative output and another produces a positive output, means to couple in opposition the output of said rectifier devices to a potentiometer device, means to store the maximum negative output of said one rectifier device reached during a first adjustment of said impedance element, means to couple said storage means to said potentiometer device, a control device coupled to the output of said potentiometer device, means coupled to said actuating means to initiate a second adjustment of said impedance element, means responsive to said control device to halt said actuating means when said maximum stored negative voltage is equalled by the output of said positive rectifier device, and means to couple said halting means to said control device during said second adjustment.

10. An automatic tuner for the tank circuit of an R. F. stage having an adjustable impedance element comprising means for actuating said adjustable impedance element through its entire range of adjustment, a pair of rectifier devices serially coupled together, means to couple a portion of the voltage of said tank circuit to said rectifier devices so that one produces a negative output and the other produces a positive output, means to store the output of one of said rectifier devices, a control device coupled to the outputs of said pair of rectifier devices and said storage means, and means responsive to said control device to halt said actuating means when said maximum stored voltage is equalled by the output of the other of said rectifier devices.

References Cited in the file of this patent

UNITED STATES PATENTS

| | | |
|---|---|---|
| 2,456,573 | White et al. | Dec. 14, 1948 |
| 2,478,977 | Nicholson | Aug. 16, 1949 |
| 2,584,004 | Enslein | Jan. 29, 1952 |